United States Patent
Wu et al.

(10) Patent No.: US 9,715,655 B2
(45) Date of Patent: Jul. 25, 2017

(54) METHOD AND APPARATUS FOR PERFORMING CLOSE-LOOP PROGRAMMING OF RESISTIVE MEMORY DEVICES IN CROSSBAR ARRAY BASED HARDWARE CIRCUITS AND SYSTEMS

(71) Applicant: THE UNITED STATES OF AMERICA AS REPRESENTED BY THE SECRETARY OF THE AIR FORCE, Washington, DC (US)

(72) Inventors: Qing Wu, Manlius, NY (US); Richard Linderman, Rome, NY (US); Garrett Rose, Clinton, NY (US); Hai Li, Pittsburg, PA (US); Yiran Chen, Pittsburg, PA (US); Miao Hu, Pittsburg, PA (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 522 days.

(21) Appl. No.: 14/328,043

(22) Filed: Jul. 10, 2014

(65) Prior Publication Data

US 2015/0170025 A1    Jun. 18, 2015

Related U.S. Application Data

(60) Provisional application No. 61/917,439, filed on Dec. 18, 2013.

(51) Int. Cl.
*G06N 3/063* (2006.01)
*G06N 3/04* (2006.01)

(52) U.S. Cl.
CPC ......... *G06N 3/0635* (2013.01); *G06N 3/0445* (2013.01)

(58) Field of Classification Search
None
See application file for complete search history.

(56) References Cited

U.S. PATENT DOCUMENTS

| | | |
|---|---|---|
| 7,302,513 B2 | 11/2007 | Mouttet |
| 7,342,413 B2 | 3/2008 | Mouttet |
| 7,378,870 B2 | 5/2008 | Mouttet |
| 7,391,235 B2 | 6/2008 | Mouttet |
| 7,447,828 B2 | 11/2008 | Mouttet |
| 7,459,933 B2 | 12/2008 | Mouttet |
| 8,391,049 B2 | 3/2013 | Jo |
| 2005/0258872 A1 | 11/2005 | Snider |

(Continued)

OTHER PUBLICATIONS

Liu et al., Digital-Assisted Noise-Eliminating Training for Memristor Crossbar-based Analog Neuromorphic Computing Engine, May 29-Jun. 7, 2013, ACM, pp. 1-6.*

(Continued)

*Primary Examiner* — Alan Chen
(74) *Attorney, Agent, or Firm* — Joseph A. Mancini

(57) ABSTRACT

Method and apparatus for performing close-loop programming of resistive memory devices in crossbar array based hardware circuits and systems. Invention provides iterative training of memristor crossbar arrays for neural networks by applying voltages corresponding to selected training patterns. Error is detected and measured as a function of the actual response to the training patterns versus the expected response to the training pattern.

28 Claims, 5 Drawing Sheets

(56) References Cited

U.S. PATENT DOCUMENTS

| | | | |
|---|---|---|---|
| 2006/0036559 A1* | 2/2006 | Nugent | G06N 3/08 706/23 |
| 2014/0172937 A1 | 6/2014 | Linderman et al. | |

OTHER PUBLICATIONS

P. Camilleri, M. Giulioni, V. Dante, D. Badoni, G. Indiveri, B. Michaelis, J. Braun, and P. Del Giudice, "A neuromorphic avlsi network chip with configurable plastic synapses," in International Conference on Hybrid Intelligent Systems, 2007, pp. 296-301.

J. Partzsch and R. Schuffny, "Analyzing the scaling of connectivity in neuromorphic hardware and in models of neural networks," IEEE Transactions on Neural Networks, vol. 22, No. 6, pp. 919-935, 2011.

M. Wang, B. Yan, J. Hu, and P. Li, "Simulation of large neuronal networks with biophysically accurate models on graphics processors," in Intl. Joint Conf. on Neural Networks (IJCNN), 2011, pp. 3184-3193.

H. Shayani, P. Bentley, and A. Tyrrell, "Hardware implementation of a bioplausible neuron model for evolution and growth of spiking neural networks on FPGA," in NASA/ESA Conference on Adaptive Hardware and Systems, 2008, pp. 236-243.

L. Chua, "Memristor—the missing circuit element," IEEE Transaction on Circuit Theory, vol. 18, 1971, pp. 507-519.

D. B. Strukov, G. S. Snider, D. R. Stewart, and R. S. Williams, "The missing memristor found," Nature, vol. 453, pp. 80-83, 2008.

Y. Ho, G.M. Huang, and P. Li, "Nonvolatile memristor memory: device characteristics and design implications," in International Conference on Computer-Aided Design (ICCAD), 2009, pp. 485-490.

M. Di Ventra, Y.V. Pershin and L.O. Chua, "Circuit elements with memory: memristors, memcapacitors, and meminductors," Proceedings of the IEEE, vol. 97, No. 10, pp. 1717-1724, 2009.

L. Chua, "Resistance switching memories are memristors," Applied Physics A: Materials Science& Processing, vol. 102, No. 4, pp. 765-783, 2011.

Q. Xia, W. Robinett, M. W. Cumbie, N. Banerjee, T. J. Cardinali, J. J. Yang, W. Wu, X. Li, W. M. Tong, D. B. Strukov, G. S. Snider, G. Medeiros-Ribeiro, and R. S. Williams, "Memristor-CMOS hybrid integrated circuits for reconfigurable logic," Nano letters, vol. 9, No. 10, pp. 3640-3645, 2009.

S. H. Jo, T. Chang, I. Ebong, B. B. Bhadviya, P. Mazumder, and W. Lu, "Nanoscale memristor device as synapse in neuromorphic systems," Nano letters, vol. 10, No. 4, pp. 1297-1301, 2010.

J. Anderson, J. Silverstein, S. Ritz, and R. Jones, "Distinctive features, categorical perception, and probability learning: some applications of a neural model." Psychological Review, vol. 84, No. 5, pp. 413, 1977.

E. M. H. Hassoun, "Associative neural memories: theory and implementation," in Oxford University Press, 1993, Chapter 4.

A. Schultz, "Collective recall via the brain-state-in-a-box network," IEEE Transactions on Neural Networks, vol. 4, No. 4, pp. 580-587, 1993.

Q. Wu, M. Bishop, R. Pino, R. Linderman, and Q. Qiu, "A multi-answer character recognition method and its implementation on a high-performance computing cluster," in 3rd International Conference on Future Computational Technologies and Applications, 2011, pp. 7-13.

M. Hu, H. Li, Y. Chen, X. Wang, and R. Pino, "Geometry variations analysis of TiO2 thin-film and spintronic memristors," in Asia and South Pacific Design Automation Conference (ASPDAC), 2011, pp. 25-30.

M. Hu, H. Li, Q. Wu and G. S. Rose, "Hardware realization of BSB recall function using memristor crossbar arrays," in Design Automation Conference (DAC), 2012, pp. 498-503.

W.E. Lillo, D.C. Miller, S. Hui and S.H. Zak, "Synthesis of brain-state-in-a-box (BSB) based associative memories," IEEE Transactions on Neural Networks, vol. 5, No. 5, pp. 730-737, 1994.

R. Perfetti, "A synthesis procedure for brain-state-in-a-box neural networks," IEEE Transactions on Neural networks, vol. 6, No. 5, pp. 1071-1080, 1995.

Y. Park, "Optimal and robust design of brain-state-in-a-box neural associative memories," IEEE Transactions on Neural Networks, vol. 23, No. 2, pp. 210-218, 2010.

Y. Pershin and M. Di Ventra, "Practical approach to programmable analog circuits with memristors," IEEE Transactions on Circuits and Systems I: Regular Papers, vol. 57, No. 8, pp. 1857-1864, 2010.

U. Ramacher and C. V. D. Malsburg, On the Construction of Artificial Brains. Springer, 2010.

T. Hasegawa, T. Ohno, K. Terabe, T. Tsuruoka, T. Nakayama, J. K. Gimzewski, and M. Aono, "Learning abilites achieved by a single solid-state atomic switch," Advanced Materials, vol. 22, No. 16, pp. 1831-1834, 2010.

K. Cantley, A. Subramaniam, H. Stiegler, R. Chapman, and E. Vogel, "Hebbian learning in spiking neural networks with nanocrystalline silicon TFTs and memristive synapses," IEEE Transactions on Nanotechnology, vol. 10, No. 5, pp. 1066-1073, 2011.

G. Howard, E. Gale, L. Bull, B. D. L. Costello, and A. Adamatzky, "Towards evolving spiking networks with memristive synapses," IEEE Symposium on Artificial Life (ALIFE), 2011, pp. 14-21.

D. Chabi, W. Zhao, D. Querlioz, and J. O. Klein, "Robust neural logic block (NLB) based on memristor crossbar array," IEEE/ACM International Symposium on Nanoscale Architectures (NANOARCH), 2011, pp. 137-143.

H. Kim, M. P. Sah, C. Yang, T. Roska, and L. O. Chua, "Neural synaptic weighting with a pulse-based memristor circuit," IEEE Transactions on Circuits and Systems I, vol. 59, No. 1, pp. 148-158, 2012.

H. Choi, H. Jung, J. Lee, J. Yoon, J. Park, D.-J. Seong, W. Lee, M. Hasan, G.-Y. Jung, and H. H. Hwang, "An electrically modifiable synapse array of resistive switching memory," Nanotechnology, vol. 20, No. 34, pp. 345201, 2009.

A. Heittmann and T. G. Noll, "Limits of writing multivalued resistances in passive nano-electronic crossbars used in circuits," ACM Great Lakes Symposium on VLSI (GLSVLSI), 2012, pp. 227-232.

K.-H. Kim, S. Gaba, D. Wheeler, J. M. Cruz-Albrecht, T. Hussain, N. Srinivasa, and W. Lu, "A functional hybrid memristor crossbar array/ CMOS system for data storage and neuromorphic applications," Nano Letters, vol. 12, No. 1, pp. 389-395, 2012.

J. J. Yang, M.-X. Zhang, M. D. Pickett, F. Miao, J. P. Strachan, W.-D. Li, W. Yi, D. A. A. Ohlberg, B. J. Choi, W. Wu, J. H. Nickel, G. Medeiros-Ribeiro, and R. S. Williams, "Engineering nonlinearity into memristors for passive crossbar applications," Applied Physics Letters, vol. 100, No. 11, pp. 113501, 2012.

G. Medeiros-Ribeiro, F. Perner, R. Carter, H. Abdalla, M. D. Pickett, and R. S. Williams, "Lognormal switching times for titanium dioxide bipolar memristors: origin and resolution," Nanotechnology, vol. 22, No. 9, pp. 095702, 2011.

W. Yi, F. Perner, M. S. Qureshi, H. Abdalla, M. D. Pickett, J. J. Yang, M.-X. M. Zhang, G. Medeiros-Ribeiro, and R. S. Williams, "Feedback write scheme for memristive switching devices," Appl. Phys. A, vol. 102, pp.973-982, 2011.

Richard A. Epstein, "The theory of gambling and statistical logic," Academic Press, 2012.

* cited by examiner

METHOD AND APPARATUS FOR PERFORMING CLOSE-LOOP PROGRAMMING OF RESISTIVE MEMORY DEVICES IN CROSSBAR ARRAY BASED HARDWARE CIRCUITS AND SYSTEMS

PRIORITY CLAIM UNDER 35 U.S.C. §119(e)

This patent application claims the priority benefit of the filing date of provisional application Ser. No. 61/917,439, having been filed in the United States Patent and Trademark Office on Dec. 18, 2013 and now incorporated by reference herein.

STATEMENT OF GOVERNMENT INTEREST

The invention described herein may be manufactured and used by or for the Government for governmental purposes without the payment of any royalty thereon.

BACKGROUND OF THE INVENTION

As the need for high performance computing continuously increases, the traditional Von Neumann computer architecture becomes less efficient. In recent years, neuromorphic hardware systems built upon the conventional CPU, GPU, or FPGA [4] gained a great deal of attention from people in industry, government and academia. Such systems can potentially provide the capabilities of biological perception and cognitive information processing within a compact and energy-efficient platform [1], [2].

As a highly generalized and simplified abstract of a biological system, an artificial neural network usually uses a weight matrix to represent a set of synapses. Accordingly, the net inputs of a group or groups of neurons can be transformed into matrix-vector multiplication(s). Similar to biological systems, neural network algorithms are inherently adaptive to the environment and resilient to random noise, however, hardware realizations of neural networks require a large volume of memory and are associated with high hardware cost if built with digital circuits [2]. Algorithm enhancement can alleviate the situation but cannot fundamentally resolve it. Thus, more efficient hardware-level solutions are necessary.

The existence of the memristor was predicted in circuit theory about forty years ago [5]. In 2008, the physical realization of a memristor was firstly demonstrated by HP Labs through a $TiO_2$ thin-film structure [6]. Afterwards, many memristive materials and devices have been rediscovered. Intrinsically, a memristor behaves similarly to a synapse: it can "remember" the total electric charge/flux ever to flow through it [8], [9]. Moreover, memristor-based memories can achieve a very high integration density of 100 $Gbits/cm^2$, a few times higher than flash memory technologies [7]. These unique properties make it a promising device for massively-parallel, large-scale neuromorphic systems [10], [11].

For the purpose of succinct description, the present invention uses the terminology "memristor" to represent the category of "resistive memory device". For the remainder of the patent description, references to "memristor" shall be regarded as referring to any "resistive memory device".

Based on circuit theory, an ideal memristor with memristance M builds the relationship between the magnetic flux φ and electric charge q that passes through the device, that is, dφ=M·dq. Since the magnetic flux and the electric charge are time dependent parameters, the instantaneous memristance varies with time and reflects the historical profile of the excitations through the device.

When developing actual memristive devices, many materials have demonstrated memristive behavior in theory and/or experimentation via different mechanisms. In general, a certain energy (or threshold voltage) is required to enable a state change in a memristor. When the electrical excitation through a memristor is greater than the threshold voltage, e.g., $|v_{in}|>|v_{th}|$, the memristance value changes. Otherwise, the memristor behaves like a resistor.

BACKGROUND ON OTHER RELATED PATENT PUBLICATIONS

To the best of our knowledge, a few existing U.S. patent publications [2][3][4][5][6][7][8][9] cover methods involving the crossbar array of programmable resistors, Ref [9] covers the method of resistance switching for the general device. Ref. [2] covers a re-configurable resistor crossbar architecture and methods of performing Boolean logic functions on it. Ref [3][4][5][6][7][8] cover methods of performing signal processing function using the re-configurable resistor crossbar architecture. However, none of the existing related patent publications cover a specific method or apparatus on programming the reconfigurable resistors in the crossbar array architecture. The present invention covers new method and apparatus of programming the resistive memory devices in the two-crossbar-array architecture to the desired states, which do not exist in other related patent publications or elsewhere in the prior art as can best be determined.

OBJECTS AND SUMMARY OF THE INVENTION

The present invention relates generally to methods and apparatuses for training arrays of resistive memory devices such as but not limited to those utilized in neural networks and neuromorphic computing applications.

It is an object of the present invention to provide training for arrays of resistive memory devices that detects the difference between expected and actual array response to training signals.

It is another object of the present invention to provide iteratively selected and applied training patterns to arrays of resistive memory devices.

In an embodiment of the present invention, a method for programming neural networks having row and column arrays of resistive memory devices where the method comprises initializing the memristors to a predetermined resistance value; determining whether a predetermined number of sequences have been trained; selecting a training pattern; inputting the training pattern to the arrays and outputting a resulting signal; detecting error by computing the difference between the input training pattern and the output signal; determining whether the detected error is a vector of all logic zero values and if so, applying a method to update the overall training progress, and returning to the step of determining whether the training is completed; otherwise, applying the method to reset the overall training progress, generating programming signals to adjust the resistance states of the memristors in the crossbars, and returning to the step of determining whether the training is completed.

In another embodiment of the present invention, an apparatus for programming neural networks having row and column arrays of resistive memory devices comprises a status tracker (ST) for determining whether the neural network training process is completed; a set of training patterns residing in a group of registers for selecting a training pattern and inputting the training pattern into the neural network; an error detector for computing the difference between the training pattern input into the neural network and an output signal therefrom; an arbiter for determining whether the detected error is a vector of all logic zero values and if so, where the status tracker updates the overall training progress, continues to select the next training pattern, and checks the training progress to determine whether the training is completed; otherwise a programming signal generator generates programming signals (based on the error detector output) to adjust the resistance states of the memristors in the crossbars, and the status tracker resets the overall training progress and checks the training progress to determine whether the training is completed.

Briefly stated, the present invention provides a method and apparatus for performing close-loop programming of resistive memory devices in crossbar array based hardware circuits and systems. The invention provides iterative training of memristor crossbar arrays for neural networks by applying voltages corresponding to selected training patterns. Error is detected and measured as a function of the actual response to the training patterns versus the expected response to the training pattern. The resistance states of the memristors in the crossbars are adjusted based on the error detection output.

In previous works, simple learning behaviors of memristor based synaptic circuits have been analyzed [24]-[28]. However, in studying the input-output feature of memristor crossbar that employs a memristor at each intersection of horizontal and vertical metal wires, we found this typical array structure can naturally provide the capability of weight matrix storage and matrix-vector multiplication (see FIG. 1). Moreover, it offers a huge number of connections. Therefore, the present invention exploits the application of the memristor crossbars in neuromorphic hardware design and use the Brain-State-in-a-Box (BSB) model [12], [13], an auto-associative neural network (see FIG. 2), to illustrate the potential of memristor crossbars in complex and large scale pattern associations and classifications.

In the present invention, the training method that iteratively adjusts the memristor crossbars to the required status is disclosed. Many physical constraints in circuit implementations have been considered, including limited data access, limited accuracy of signal detection, non-ideal memristor characteristics [6], process variations and defects. The present invention generates the programming signals for iterative training using the sign of input signals and the magnitude differences between the output signals and the expected outputs. By avoiding directly reading the memristance values of the crossbars, the present invention significantly reduces the design complexity and avoids analog-to-digital converter (ADC) circuits.

Circuit Realization of Matrix-Vector Multiplication Approximation

The present invention builds upon the apparatus of performing matrix-vector multiplication approximation using two crossbar arrays of resistive memory devices and applying to realizing the auto-associative neural network recall function, which are covered by a previous US patent application [1]. The present invention covers the method and apparatus of programming the resistive memory devices in the two crossbar arrays to the desired states, which are not covered by [1].

To realize the matrix-vector multiplication approximation function $y = A \cdot x$ at the circuit level, the elements of the input vector x are converted to the range of input voltage levels VI. The corresponding functions for the multiplication approximation can be expressed as:

$$VO = \frac{g_s}{g_{max}}(VO^+ - VO^-) \quad (1)$$

where $$VO^+ = \hat{A}^+ \cdot VI \text{ and } VO^- = \hat{A}^- \cdot VI \quad (2)$$

where $$VI = \frac{v_{bn}}{|x_{max}|} \cdot x \quad (3)$$

where $|x_{max}|$ is the maximum possible magnitude of any element of input vector x, and $v_{bn}$ is the input voltage boundary, that is, $-v_{bn} \leq vi_j \leq v_{bn}$ for any $vi_j \in VI$. In implementation, $v_{bn}$ must be smaller than $v_{th}$ so that the memristance values will not change during the multiplication operation.

As shown in FIG. 1, the memristor crossbar arrays 20, 30 are used to realize the matrix-vector multiplication approximation operation. To obtain both positive and negative elements in the matrix, two memristor crossbar arrays $M_1$ 20 and $M_2$ 30 are required in the design to represent the positive and negative matrices $\hat{A}^+$ and $\hat{A}^-$, respectively. The memristor crossbar arrays have the same dimensions as the transposed matrix A. The input signal VI along with $VO^+$ and $VO^-$, the corresponding voltage outputs of two memristor crossbar arrays, are fed into a number of analog subtraction amplifier circuits.

Resulting from the scaled mapping method, the required VO should be $g_s/g_{max}$ times the generated $VO^+$ or $VO^-$. In the present invention, we set $R_1 = R_2 = 1/g_s$ and $R_3 = R_4 = 1/g_{max}$. The resulting output of the subtraction amplifier is:

$$vo_i = \frac{g_s}{g_{max}} \cdot vo_i^+ - \frac{g_s}{g_{max}} \cdot vo_i^- \quad (4)$$

which indicates that the scaled effect (caused by mapping from A to $\hat{A}^+$ and $\hat{A}^-$) has been canceled out. The M-by-N dimensional matrix requires M summing amplifiers to realize the subtraction operation in Eq. (4). Also, for subtraction amplifiers 40, their power supplies should be adjusted to make their maximum/minimum output voltages to reflect the same scaling factor when converting the input vector x to voltage VI. Finally the resulting vector y can be obtained from VO with inversed scaling factor of x, as shown in Eq. (5).

$$y = \frac{|x_{max}|}{v_{bn}} \cdot VO \quad (5)$$

Circuit Realization of Auto-Associative Neural Network Recall Function

Referring to FIG. 2, The Brain-State-in-a-Box (BSB) model is a typical auto-associative neural network. The mathematical model of the BSB recall function can be represented as:

$$x(t+1) = S(\alpha \cdot A \cdot x(t) + \lambda \cdot x(t)) \quad (6)$$

where x is an N dimensional real vector, and A is an N-by-N connection matrix. $A \cdot x(t)$ is a matrix-vector multiplication operation, which is the main function of the recall function. α is a scalar constant feedback factor. λ is an inhibition decay constant. S(y) is the "squash" function defined as:

$$S(y) = \begin{cases} 1, & \text{if } y \geq 1 \\ y, & \text{if } -1 < y < 1 \\ -1, & \text{if } y \leq -1 \end{cases} \quad (7)$$

For a given input pattern x(0), the recall function computes Eq. (16) iteratively until convergence, that is, when all entries of x(t+1) are either "1" or "−1".

Using the same method for general matrix-vector multiplication approximation described previously, Eq. (16) converts to:

$$x(t+1) = S(\hat{A}^+ \cdot x(t) - \hat{A}^- \cdot x(t) + x(t)) \quad (8)$$

Here, for the default case we set α=λ=1. The two connection matrices $A^+$ and $A^-$ can be mapped to two N-by-N memristor crossbar arrays $M_3$ 20 and $M_4$ 30 in a scaled version $\hat{A}^+$ and $\hat{A}^-$, respectively.

To realize the BSB recall function at the circuit level, the normalized input vector x(t) is converted to a set of input voltage signals V(t). The corresponding function for the voltage feed-back system can be expressed as:

$$V(t+1) = S'(\hat{A}^+ \cdot V(t) - \hat{A}^- \cdot V(t) + V(t)) \quad (9)$$
$$= S'(V_{A+}(t) - V_{A-}(t) + V(t))$$

$v_{bn}$ represents the input voltage boundary, that is, $-v_{bn} \leq v_i(t) \leq v_{bn}$ for any $v_i(t) \in V(t)$. The new saturation boundary function S'( ) needs to be modified accordingly as:

$$S'(v) = \begin{cases} v_{bn}, & \text{if } v \geq v_{bn} \\ v, & \text{if } -v_{bn} < v < v_{bn} \\ -v_{bn}, & \text{if } v \leq -v_{bn} \end{cases}$$

In implementation, $v_{bn}$ can be adjusted based on requirements for convergence speed and accuracy. Meanwhile, $v_{bn}$ must be smaller than $v_{th}$ so that the memristance values will not change during the recall process.

Still referring to FIG. 2 illustrates the BSB recall circuit built based on Eq. (9). The design is an analog system consisting of three major components. The selector (switch) 60 selects V(0) as input voltage at the start of the recall computation, then selects V(t+1) afterward. We assume that "t" is discretized time, so we have t=0, 1, 2, . . . . After the output voltages are all converged, we reset t=0 so that the circuit takes the new input V(0) to be computed (recalled). Below is the detailed description.

Memristor crossbar arrays: As the key component of the overall design, the memristor crossbar arrays 20, 30, are used to approximate the matrix-vector multiplication functions in the BSB recall operation. To obtain both positive and negative weights in the original BSB algorithm in Eq. (6), two N-by-N memristor crossbar arrays $M_3$ 20 and $M_4$ 30 are required in the design to represent the connection matrices $\hat{A}^+$ and $\hat{A}^-$, respectively. The memristor crossbar arrays have the same dimensions as the BSB weight matrix A transposed.

Summation-subtraction amplifiers: The input signal $v_i(t)$ along with $v_{\hat{A}_{+,i}}(t)$ and $v_{\hat{A}_{-,i}}(t)$, the corresponding voltage outputs of two memristor crossbar arrays, are fed into a summation-subtraction amplifier 40.

Resulting from the decayed mapping method, the required $v_{A_{+,i}}(t)$ and $v_{A_{-,i}}(t)$ should be $g_s/g_{max}$ times of the generated $v_{\hat{A}_{+,i}}(t)$ and $v_{\hat{A}_{-,i}}(t)$, respectively. In the present invention $R_1 = R_4 = R_6 = 1/g_s$, and $R_2 = R_3 = R_5 = R_7 = 1/g_{max}$. The resulting output of the summation-subtraction amplifier 40 is:

$$v_i(t+1) = \frac{g_s}{g_{max}} \cdot v_{\hat{A}_{+,i}}(t) - \frac{g_s}{g_{max}} \cdot v_{\hat{A}_{-,i}}(t) + v_i(t) \quad (10)$$
$$= v_{A_{+,i}}(t) - v_{A_{-,i}}(t) + v_i(t)$$

which indicates that the decayed effect has been canceled out. The N dimensional BSB model requires N summation-subtraction amplifiers 40 to realize the addition/subtraction operation in Eq. (10). Also, for the amplifiers, we should adjust their power supply levels to make their maximum/minimum output voltages to be equal to ±$v_{bn}$, respectively. In the present invention the resistances $R_1$ through $R_7$ can be adjusted to match the required α and λ in Eq. (6), if they are not the default value 1.

Comparator: Once a new set of voltage signals V(t+1) is generated from the summation-subtraction amplifiers 40, the present invention sends them back as the input of the next iteration. Meanwhile, each $v_i(t+1) \in V(t+1)$ is compared to $v_{bn}$ and $-v_{bn}$ so that when $v_i$ equals to either $v_{bn}$ or $-v_{bn}$, we deem the output i as having "converged". The recall operation stops when all N outputs reach convergence. In total, N comparators 50 are needed to cover all the outputs.

There are three major physical constraints in the circuit implementation: (1) For any $v_i(0) \in V(0)$, the voltage amplitude of initial input signal $v_i(0)$ is limited by the input circuit (2) boundary voltage $v_{bn}$ must be smaller than $v_{th}$ of memristors; and (3) the summation-subtraction amplifier 40 has finite resolution.

In the BSB recall function, the ratio between boundaries of S(y) and the initial amplitude of $x_i(0)$, $x_i(0) \in x(0)$ determines the learning space of the recall function. If the ratio is greater than the normalized value, the recall operation will take more iterations to converge with a higher accuracy. Otherwise, the procedure converges faster by lowering stability. Thus, minimizing the ratio of $|v_i(0)|$ and $v_{bn}$ can help obtain the best performance. However, the real amplifier has a finite resolution and $v_{bn}$ is limited within $v_{th}$ of the memristor 10. Continuously reducing $|v_i(0)|$ eventually will lose a significant amount of information in the recall circuit.

The above, and other objects, features and advantages of the present invention will become apparent from the following description read in conjunction with the accompanying drawings, in which like reference numerals designate the same elements.

REFERENCES

[1] U.S. patent application Ser. No. 13/965,459, R. W. Linderman, et al, "Apparatus for Performing Matrix-Vector Multiplication Approximation Using Crossbar Arrays of Resistive Memory Devices," filed Aug. 13, 2013.
[2] U.S. Patent, US 2005/0258872 A1, G. S. Snider, "Architecture and Methods for Computing with Reconfigurable Resistor Crossbars," November 2005.
[3] U.S. Pat. No. 7,302,513, B. L. Mouttet, "Programmable Crossbar Signal Processor," November 2007.

[4] U.S. Pat. No. 7,342,413, B. L. Mouttet, "Programmable Crossbar Signal Processor with Input/Output Tip Interconnection," March 2008.

[5] U.S. Pat. No. 7,378,870, B. L. Mouttet, "Programmable Crossbar Signal Processor with Rectification Layer," March 2008.

[6] U.S. Pat. No. 7,391,235, B. L. Mouttet, "Programmable Crossbar Signal Processor with Op-Amp Outputs," June 2008.

[7] U.S. Pat. No. 7,447,828, B. L. Mouttet, "Programmable Crossbar Signal Processor Used As Morphware," November 2008.

[8] U.S. Pat. No. 7,459,933, B. L. Mouttet, "Programmable Crossbar Signal Processor Used in Image Processing," December 2008.

[9] U.S. Pat. No. 8,391,049 B2, S. H. Jo, "Resistor Structure for a Non-Volatile Memory Device and Method," March 2013.

[10] P. Camilleri, M. Giulioni, V. Dante, D. Badoni, G. Indiveri, B. Michaelis, J. Braun, and P. del Giudice, "A neuromorphic avlsi network chip with configurable plastic synapses," in *International Conference on Hybrid Intelligent Systems*, 2007, pp. 296-301.

[11] P. Partzsch and R. Schuffny, "Analyzing the scaling of connectivity in neuromorphic hardware and in models of neural networks," *IEEE Transactions on Neural Networks*, vol. 22, no. 6, pp. 919-935, 2011.

[12] M. Wang, B. Yan, J. Hu, and P. Li, "Simulation of large neuronal networks with biophysically accurate models on graphics processors," in *Intl. Joint Conf. on Neural Networks (IJCNN)*, 2011, pp. 3184-3193.

[13] H. Shayani, P. Bentley, and A. Tyrrell, "Hardware implementation of a bioplausible neuron model for evolution and growth of spiking neural networks on FPGA," in *NASA/ESA Conference on Adaptive Hardware and Systems*, 2008, pp. 236-243.

[14] L. Chua, "Memristor—the missing circuit element," *IEEE Transaction on Circuit Theory*, vol. 18, 1971, pp. 507-519.

[15] D. B. Strukov, G. S. Snider, D. R. Stewart, and R. S. Williams, "The missing memristor found," *Nature*, vol. 453, pp. 80-83, 2008.

[16] Y. Ho, G. M. Huang, and P. Li, "Nonvolatile memristor memory: device characteristics and design implications," in *International Conference on Computer-Aided Design (ICCAD)*, 2009, pp. 485-490.

[17] M. Di Ventra, Y. V. Pershin and L. O. Chua, "Circuit elements with memory: memristors, memcapacitors, and meminductors," *Proceedings of the IEEE*, vol. 97, no. 10, pp. 1717-1724, 2009.

[18] L. Chita, "Resistance switching memories are memristors," *Applied Physics A: Materials Science & Processing*, vol. 102, no. 4, pp. 765-783, 2011.

[19] Q. Xia, W. Robinett, M. W. Cumbie, N. Banerjee, T. J. Cardinali, J. J. Yang, W. Wu, X. Li, W. M. Tong, D. B. Strukov, G. S. Snider, G. Medeiros-Ribeiro, and R. S. Williams, "Memristor-CMOS hybrid integrated circuits for reconfigurable logic," *Nano letters*, vol. 9, no, 10, pp. 3640-3645, 2009.

[20] S. H. Jo, T. Chang, I. Ebong, B. B. Bhadviya, P. Mazumder, and W. Lu, "Nanoscale memristor device as synapse in neuromorphic systems," *Nano letters*, vol. 10, no. 4, pp. 1297-1301, 2010.

[21] J. Anderson, J. Silverstein, S. Ritz, and R. Jones, "Distinctive features, categorical perception, and probability learning: some applications of a neural model." *Psychological Review*, vol. 84, no. 5, pp. 413, 1977.

[22] E. M. H. Hassoun, "Associative neural memories: theory and implementation," in *Oxford University Press*, 1993, Chapter 4.

[23] A. Schultz, "Collective recall via the brain-state-in-a-box network," *IEEE Transactions on Neural Networks*, vol. 4, no. 4, pp. 580-587, 1993.

[24] Q. Wu, M. Bishop, R. Pino, R. Linderman, and Q. Qiu, "A multi-answer character recognition method and its implementation on a high-performance computing cluster," in *3rd International Conference on Future Computational Technologies and Applications*, 2011, pp. 7-13.

[25] M. Hu, H. Li, Y. Chen, X. Wang, and R. Pino, "Geometry variations analysis of $TiO_2$ thin-film and spintronic memristors," in *Asia and South Pacific Design Automation Conference (ASPDAC)*, 2011, pp. 25-30.

[26] M. Hu, H. Li, Q. Wu and G. S. Rose, "Hardware realization of BSB recall function using memristor crossbar arrays," in *Design Automation Conference (DAC)*, 2012, pp. 498-503.

[27] W. E. Lillo, D. C. Miller, S. Hui and S. H. Zak, "Synthesis of brain-state-in-a-box (BSB) based associative memories," *IEEE Transactions on Neural Networks*, vol. 5, no. 5, pp. 730-737, 1994.

[28] R. Perfetti, "A synthesis procedure for brain-state-in-a-box neural networks," *IEEE Transactions on Neural networks*, vol. 6, no. 5, pp. 1071-1080, 1995.

[29] Y. Park, "Optimal and robust design of brain-state-in-a-box neural associative memories," *IEEE Transactions on Neural Networks*, vol. 23, no 2, pp. 210-218, 2010.

[30] Y. Pershin and M. Di Ventra, "Practical approach to programmable analog circuits with memristors," *IEEE Transactions on Circuits and Systems I: Regular Papers*, vol. 57, no. 8, pp. 1857-1864, 2010.

[31] U. Ramacher and C. V. D. Malsburg, *On the Construction of Artificial Brains*. Springer, 2010.

[32] T. Hasegawa, T. Ohno, K. Terabe, T. Tsuruoka, T. Nakayama, J. K. Girazewski, and M. Aono, "Learning abilities achieved by a single solid-state atomic switch," *Advanced Materials*, vol. 22, no, 16, pp. 1831-1834, 2010.

[33] K. Cantley, A. Subramaniam, H. Stiegler, R. Chapman, and E. Vogel, "Hebbian learning in spiking neural networks with nano-crystalline silicon TFTs and memristive synapses," *IEEE Transactions on Nanotechnology*, vol. 10, no 5, pp. 1066-1073, 2011.

[34] G. Howard, E. Gale, L. Bull, B. d. L. Costello, and A. Adamatzky, "Towards evolving spiking networks with memristive synapses," *IEEE Symposium on Artificial Life (ALIFE)*, 2011, pp. 14-21.

[35] D. Chabi, W. Zhao, D. Querlioz, and J. O. Klein, "Robust neural logic block (NLB) based on memristor crossbar array," *IEEE/ACM International Symposium on Nanoscale Architectures (NANOARCH)*, 2011, pp. 137-143.

[36] H. Kim, M. P. Sah, C. Yang, T. Roska, and L. O. Chua, "Neural synaptic weighting with a pulse-based memristor circuit," *IEEE Transactions on Circuits and Systems I*. vol. 59, no. 1, pp. 148-158, 2012.

[37] H. Choi, H. Jung, J. Lee, J. Yoon, J. Park, D.-J. Seong, W. Lee, M. Hasan, G.-Y. Jung, and H. H. Hwang, "An electrically modifiable synapse array of resistive switching memory," *Nanotechnology*, vol. 20, no. 34, pp. 345201, 2009.

[38] A. Heittmann and T. G. Noll, "Limits of writing raultivalued resistances in passive nano-electronic crossbars used in neuromorphic circuits," *ACM Great Lakes Symposium on VLSI (GLSVLSI)*, 2012, pp. 227-232.

[39] K.-H. Kim, S. Gaba, D. Wheeler, J. M. Cruz-Albrecht, T. Hussain, N. Srinivasa, and W. Lu, "A functional hybrid memristor crossbar array/CMOS system for data storage and neuromorphic applications," *Nano Letters*, vol. 12, no. 1, pp. 389-395, 2012.

[40] J. J. Yang, M.-X. Zhang, M. D. Pickett, F. Miao, J. P. Strachan, W.-D, Li, W. Yi, D. A. A. Ohlberg, B. J. Choi, W. Wu, J. H. Nickel, G. Medeiros-Ribeiro, and R. S. Williams, "Engineering nonlinearity into memristors for passive crossbar applications," *Applied Physics Letters*, vol. 100, no. 11, pp. 113501, 2012.

[41] G. Medeiros-Ribeiro, F. Perner, R, Carter, H. Abdalla, M. D. Pickett, and R. S. Williams, "Lognormal switching times for titanium dioxide bipolar memristors: origin and resolution," *Nanotechnology*, vol. 22, no. 9, pp. 095702, 2011.

[33] W. Yi, F. Perner, M. S. Qureshi. H, Abdalla, M. D. Pickett, i. J. Yang, M.-X. M. Zhang, G. Medeiros-Ribeiro, and R. S. Williams, "Feedback write scheme for memristive switching devices," *Appl. Phys. A,* vol. 102, pp. 973-982, 2011.

[34] Richard A. Epstein, "The theory of gambling and statistical logic," Academic Press, 2012,

DETAILED DESCRIPTION OF THE PREFERRED EMBODIMENT

A Simplified Delta-Rule Training Method

Figure 1:
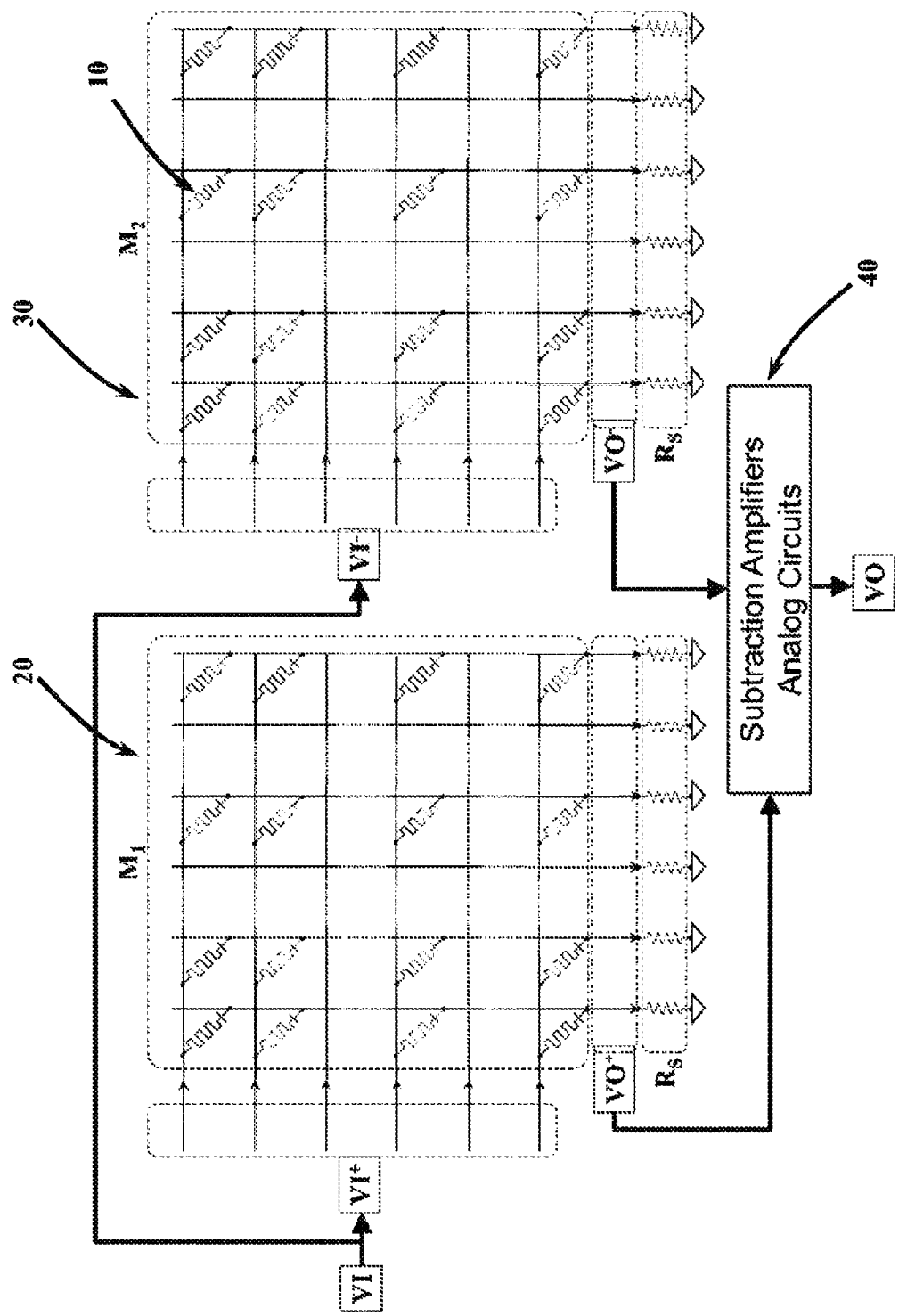
FIG. 1 depicts a generic matrix vector multiplication circuit comprised of arrays of memristors.

---
Algorithm 1. Training algorithm using Delta rule.
---

Step 0. Initialize weights (zero or small random values). Initialize learning rate $\alpha$.

Step 1. Randomly select one prototype (training) pattern $\gamma^{(k)} \in B^n$, k = 1, ..., m. $B^n$ is the n-dimension binary space (−1, 1). Set target (expected) output to the external input prototype pattern $\gamma^{(k)}: t_i = \gamma_i$.

Step 2. Compute net inputs:

$$y_{in_i} = \sum_j \gamma_j w_{ji}$$

(Each net input is a combination of weighted signals received from all units.)

Step 3. Each unit determines its activation (output signal):

$$y_i = S(y_{in_i}) = \begin{cases} 1, & y_{in_i} \geq 1 \\ y_{in_i}, & -1 < y_{in_i} < 1 \\ -1, & y_{in_i} \leq -1 \end{cases}$$

Step 4. Update weights: $\Delta w_{ij} = \alpha \cdot (t_j - y_j) \cdot \gamma_i$ Step 5. Repeat Steps 1-4 until the condition $|t(i) - y(i)| < \theta$ is satisfied in m consecutive iterations.

---

A software generated weight matrix can be mapped to the memristor crossbar arrays 20, 30 based on the assumption that every memristor in the crossbar could be perfectly programmed to the required resistance value, however, the traditional crossbar programming method faces accuracy and efficiency limitations due to the existence of the sneak paths [29]. Although some recent works were presented to improve the write/read ability of memristor crossbars by leveraging the device nonlinearity [31], the controllability of analog state programming is still limited. In spite of preparing the memristor crossbars with open-loop writing operations, the present invention discloses a close-loop programming method which iteratively adjusts the resistance states of the memristors in the crossbars to the target values. The present invention's technique is based on a modification of the above software training algorithm.

The Delta rule in Algorithm 1 is used as an example. A weight $w_{ij}$ corresponds to the analog resistance state of the memristor 10 at the cross-point of the ith row and the jth column in a crossbar array. A weight updating $\Delta w_{ij}$ involves multiplying three analog variables: $\alpha$, $t_j - y_j$, and $x_i$. Though these variables are available in training scheme design, the hardware implementation to obtain their multiplication demands very high computation resource overhead. Therefore, we simplify the weight updating function by trading off the convergence speed as:

$$\Delta w_{ij} = \alpha \cdot \text{sign}(t_j - y_j) \cdot \text{sign}(x_h) \qquad (11)$$

Here, $\text{sign}(t_j - y_j)$ and $\text{sign}(x_i)$ are the polarities of $t_j - y_j$ and $x_i$, respectively. They can be either +1 or −1. $\text{sign}(t_j - y_j) \cdot \text{sign}(x_i)$ represents the direction of the weight change. At each training iteration, the rate of the weight changes remains constant which is controlled by the learning rate $\alpha$.

This simplification approach minimizes the circuit design complexity while ensuring the weight change in the same direction as that of the original Delta rule. As a tradeoff, a higher number of iterations may be required to reach a converged weight matrix since the weight change is not the steepest descent as that in Algorithm 1. However, the modification will not affect the training quality much since the decision criterion of the algorithm remains as the error between the actual and expected output patterns.

Hardware Realization of Close-Loop Memristor Programming

Figure 3:
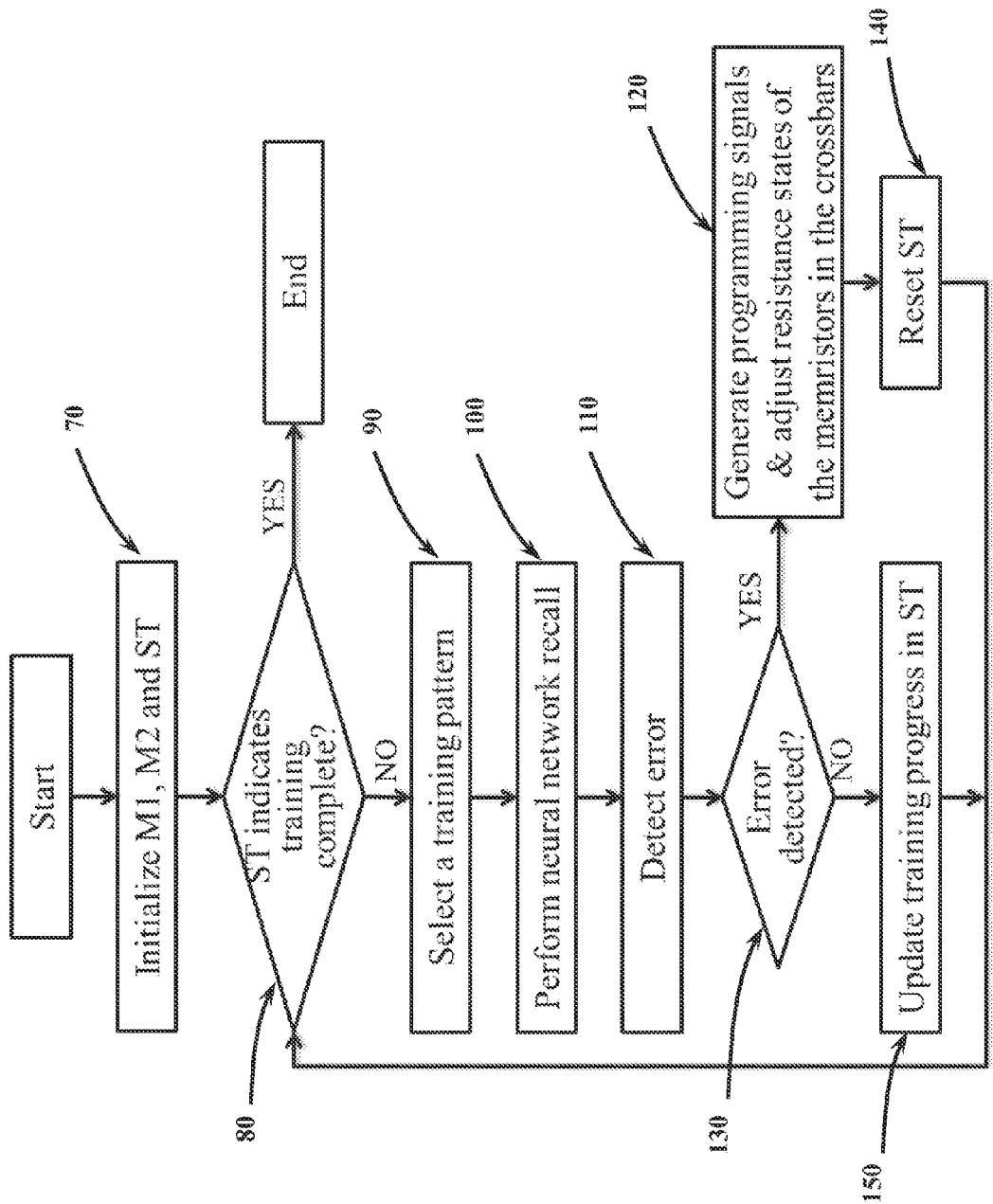
FIG. 3 depicts the process steps to be performed in implementing the present invention.
Figure 4:
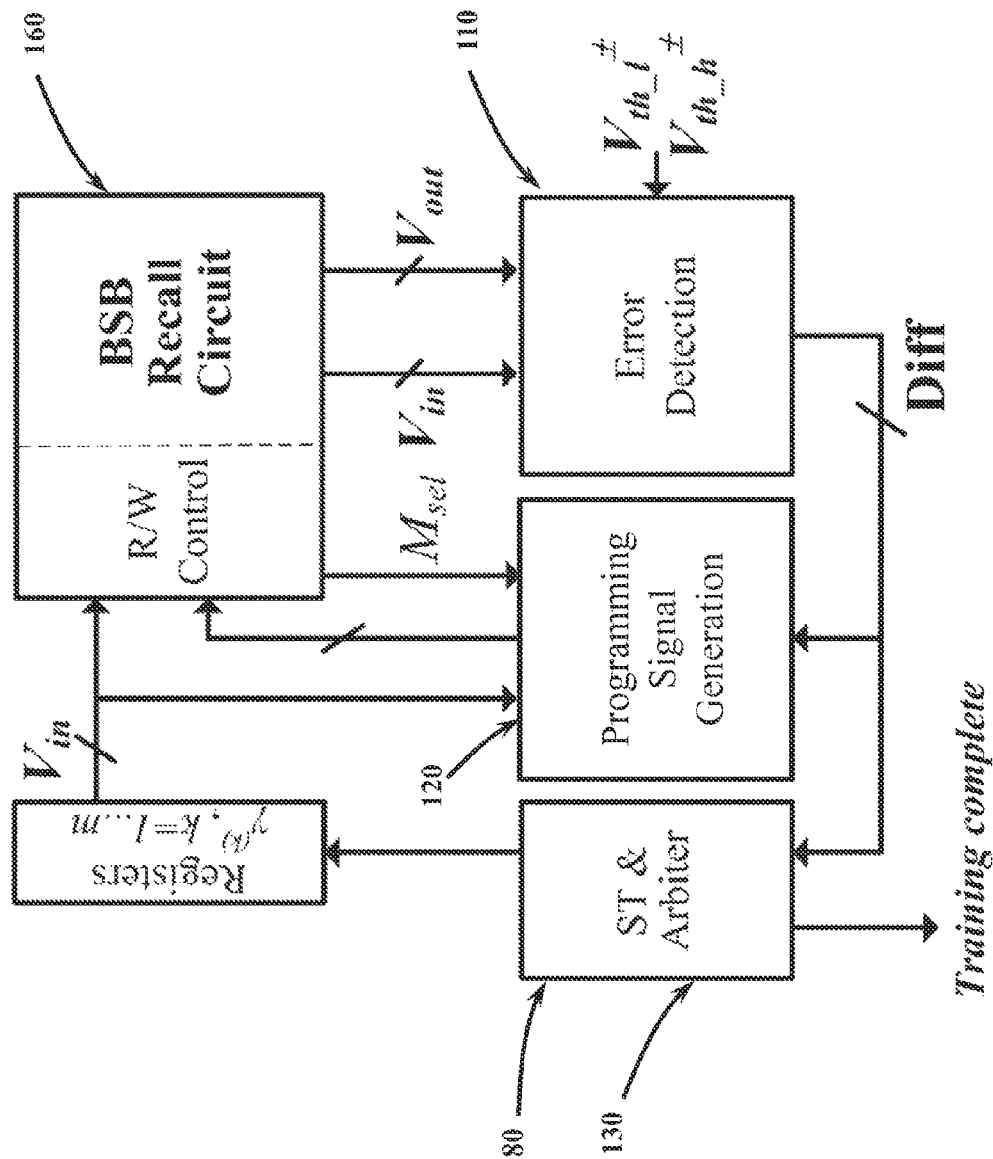
FIG. 4 depicts the functional elements of the present invention.

Referring to FIG. 3 summarizes the operational flow of the BSB training circuit of the present invention. And the corresponding circuit diagram is illustrated in FIG. 4. The present invention's purpose is to provide a method to train the memristor crossbars 20, 30 as auto-associative memories for a set of training patterns. The training scheme leverages the recall circuit to verify the training result and generate the control signals. FIG. 3 depicts the present invention's method as it would be performed through computer software instructions, i.e., implemented in software. FIG. 4 depicts the present invention implemented in hardware, with the functional hardware blocks clearly depicted in communication with the BSB recall circuit being trained. The scope of the present invention is intended to include both the herein disclosed software method and hard ware apparatus embodiments to train memristive crossbar arrays.

Still referring to FIG. 4, the major components of the design for the present invention will be described. Among these components, the BSB Recall Circuit 160 is the same as described in FIG. 2. The R/W Control component of the BSB Recall Circuit 160 generates the signals to perform the "Read" (recall) operation and the "Write" (programming) operation to the crossbar arrays. The Error Detection component 110 performs the error detection function as described in Step 4. The Programming Signal Generation component 120 generates the programming signals based on "Vin" and "Diff" signals, as described in Step 5; The Status Tracker (ST) & Arbiter component 80, 130 keeps track of the overall training progress to determine whether training is completed, as well as controls the selection of the next training pattern. The Register component 170 stores all the training patterns and output one of them based on the input from the ST & Arbiter 80, 130 component.

Referring now to FIG. 3 and FIG. 4 concurrently:

Step 1: Initializing the crossbar arrays. At the beginning of a training procedure, all memristance values 10 in $M_1$ 20 and $M_2$ 30 are initialized 70 to an intermediate value. The initialization 70 doesn't have to be precisely accurate. Indeed, even when all of the memristors 10 are all at either LRS or HRS, the crossbar arrays 20, 30 can still be successfully trained but it requires more time to reach convergence. For instance, training from HRS takes about 2,500 iterations, while initializing the memristors to intermediate states within their resistance range can reduce the iteration number to about 1,000 iterations.

Step 2: Selecting a prototype pattern $\gamma^{(k)} \in B^n$ (k=1, ..., m). Here, $B^n$ is the n-dimension binary space (-1, 1). Assume a training set includes m prototype patterns and each pattern; $\gamma^{(k)}$ has the same probability to be chosen every time. The ST 80 is used to keep track of the overall training progress, e.g., the patterns that have been successfully trained. When the ST is not reset, those patterns that have been trained are excluded by the arbiter 130 (see FIG. 4) from the selection 90.

Figure 2:
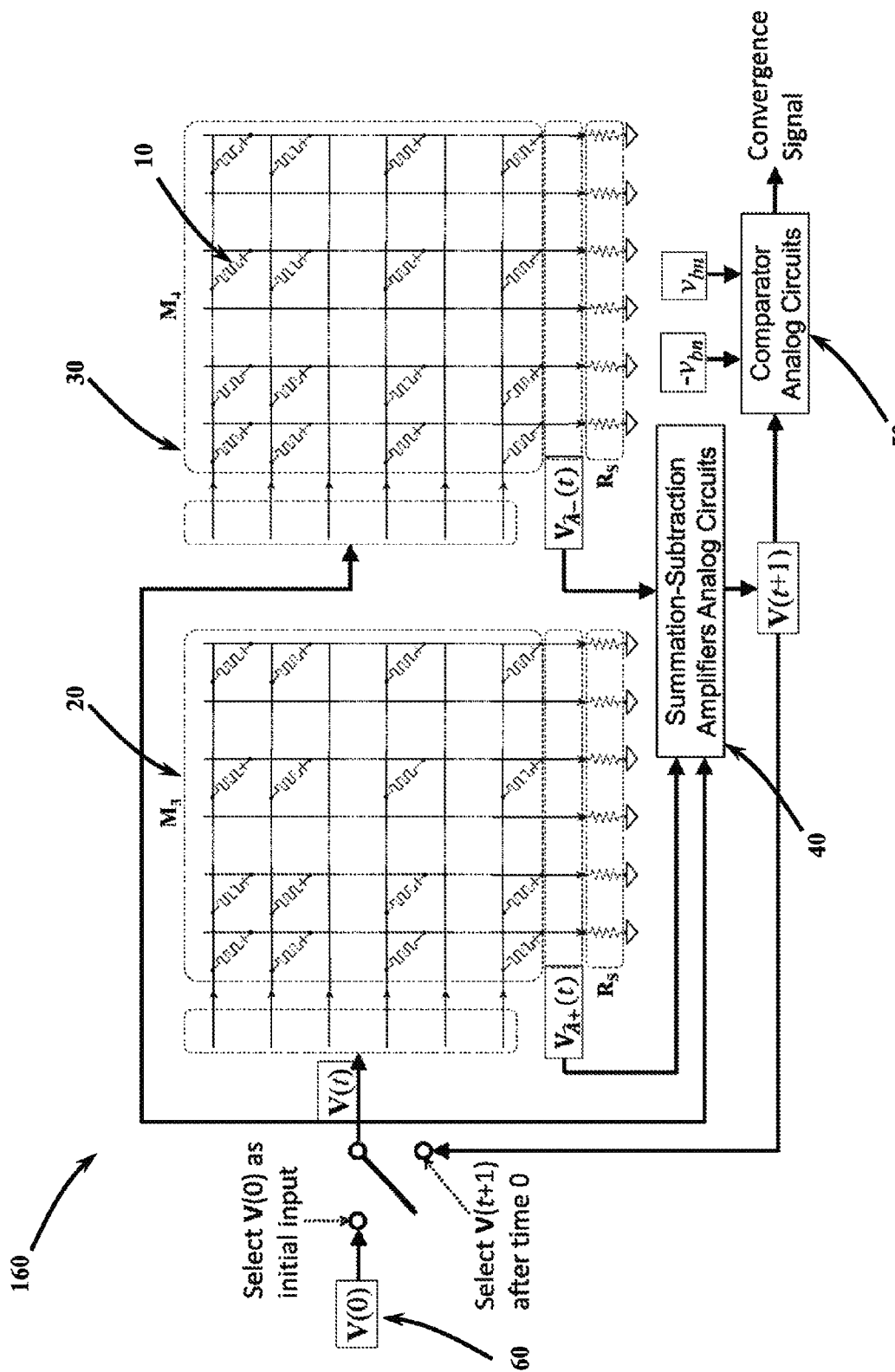
FIG. 2 depicts a matrix vector multiplication circuit comprised of arrays of memristors which employs an auto associative neural network Brain-State-in-a-Box.

Step 3: Sending $\gamma^{(k)}$ to the BSB recall circuit (as shown in FIG. 2). The present invention converts $\gamma^{(k)}$ in binary space (-1, 1) to a set of input voltages within the boundary (-0.1 V, 0.1 V). These input signals are supplied 100 to the two memristor crossbars 20, 30 simultaneously. The resulting signals $V_O$ can be obtained at the output of the BSB recall circuit.

Figure 5:
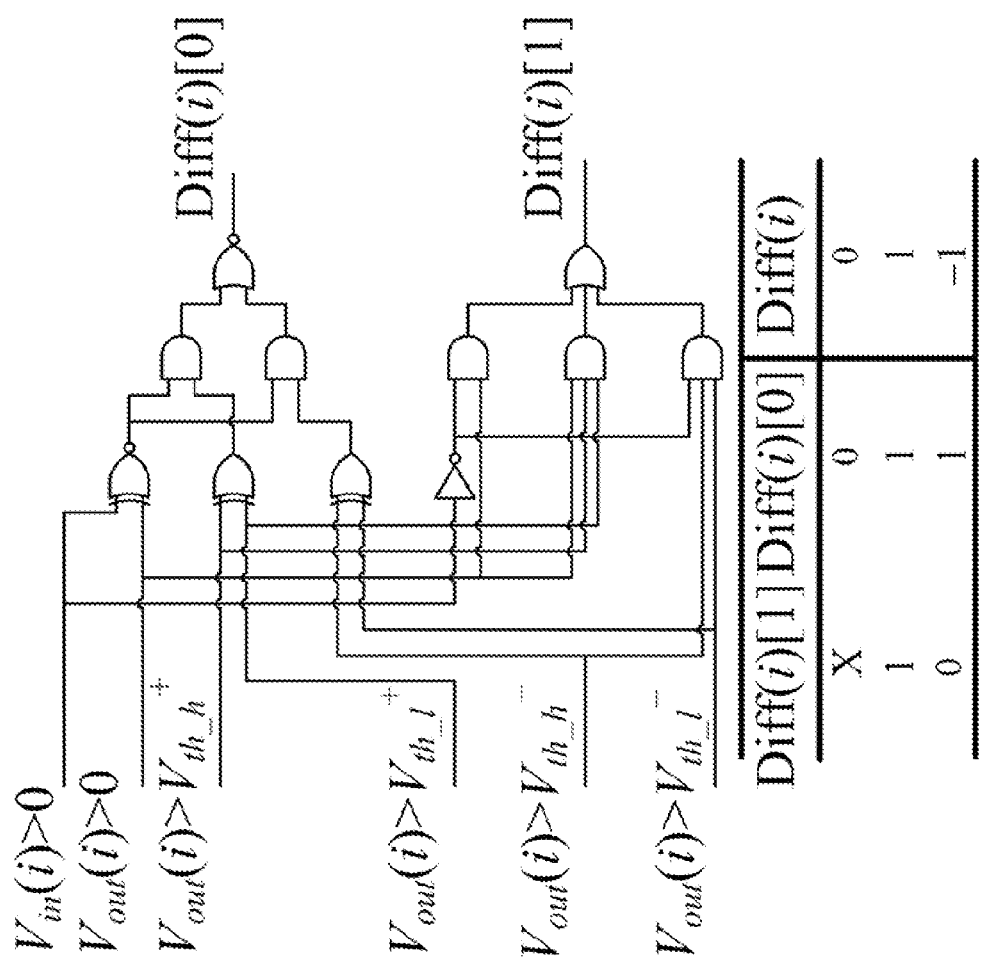
FIG. 5 depicts the detailed circuit design of the error detection block of the present invention.

Step 4: Error detection. An error is defined as the difference between the prototype pattern and the recall result; that is, the difference between the input and output signals of the recall circuit. An error detection 110 circuitry for bit i (see FIG. 5) generates only the direction of the weight change based on the simplified algorithm. In total, N error detection circuitries are needed for an N×N crossbar array.

Considering that the range of $V_{out}(i)$ could be different from that of $V_{in}(i)$, we apply a scalar $\lambda$ to the input vector and take $\lambda \cdot V_{in}(i)$ as the target output signal. Rather than generating $\lambda \cdot V_{in}(i)$ in every training, the present invention uses the preset threshold voltages for error detection. Since $V_{in}(i)$ is either 0.1 V or -0.1 V, four thresholds are needed, including $$V_{th\_h}^+ = 0.1\lambda + \theta, \quad V_{th\_l}^+ = 0.1\lambda - \theta$$

$$V_{th\_h}^- = 0.1\lambda - \theta, \quad V_{th\_l}^- = -0.1\lambda + \theta, \tag{12}$$

Here, $\theta$ represents the tolerable difference.

The error detection output Diff(i) 110 could be -1, 0, or 1. When $|V_{out}(i) - \lambda \cdot V_{in}(i)| < \theta$, Diff(i)=0, meaning the difference between the normalized $V_{in}(i)$ and $V_{out}(i)$ are so small that we consider them logically identical. Otherwise, Diff(1)=+1 or -1, indicating the normalized $|V_{out}(i)|$ is greater or less than the normalized $|V_{in}(i)|$, respectively.

Step 5: Training memristor crossbar arrays. If Diff 130 is not a vector of logic zero values, which means some error has been detected, the crossbar arrays need to be further tuned. The programming signal generation is based on the training rule defined by (13). In order to control the training step 120 with a finer granularity, we modify only one of the two memristor crossbars each time. For example, one could train $M_1$ 20 or $M_2$ 30 when the iteration number is odd or even, respectively.

The training of a memristor crossbar array is conducted column-by-column. The polarity and amplitude of the programming pulse for the jth column are determined by Diff(j). The design supplies the programming pulses on all the rows of a memristor crossbar. The jth column is connected to ground and all the others are disconnected. For $M_1$, the programming signals is either the current selected prototype pattern $\gamma^{(k)}$ (when Diff(j)=1) or its element-wise negated version (when Diff(j)=-1). The programming signals to $M_1$ 20 and $M_2$ 30 have opposite polarities. That is, the programming signals of $M_2$ 30 uses the current prototype pattern when Diff(j)=-1 or its element-wise negated version when Diff(j)=1.

Note that the mapping method uses $M_1$ 20 and $M_2$ 30 to represent the positive and negative terms of the BSB weight matrix, respectively. However, the proposed training scheme operated in real design circumstance cannot and does not have to guarantee an identical mapping to software generated matrix defined in (11). In fact, what matters most is the overall effect of $M_1$ 20 and $M_2$, 30 not exact memristance values 10 in each individual crossbar array.

Step 6: If training is completed? The ST updates the training progress 150 if a prototype pattern goes through Steps 2-5 and reports no error without further tuning $M_1$ and $M_2$. Otherwise, ST resets the training progress 140 whenever an error is detected and all of the patterns in $B^n$ are available in Step 2. When ST 80 indicates that the entire training set has been successfully "learned" the training progress terminates.

Design Robustness Considerations

Running the BSB recall circuit 160 (see FIG. 2) under the ideal condition should obtain the same results as the mathematical algorithm. Unfortunately, the noise induced by process variations and signal fluctuations can significantly affect circuit performance. These noise sources at the component level can be modeled and their impact on the physical design challenges of the present invention, analyzed.

1) Process Variations

Memristor Crossbar Arrays: The real memristance matrix M' of a memristor crossbar array could be quite different from the theoretical M due to process variations. The difference can be represented by a noise matrix $N_M$, which includes two contributors: the systematic noise $N_{M,sys}$ and the random noise $N_{M,rdm}$. Consequently, M' can be expressed by:

$$M' = M \circ N_M = M \circ (1 + N_{M,sys} + N_{M,rdm}) \tag{13}$$

where $\circ$ stands for Hadamard product. The impact of $N_M$ on the connection matrix C is too complex to be expressed by a mathematical closed-form solution. But numerical analysis shows that it can be approximated by:

$$C_M' = C \circ N_{CM} = C \circ \frac{1}{N_M} \circ \frac{1}{N_M} \tag{14}$$

where $C_M'$ is the connection matrix after including memristance process variations. $N_{CM}$ is the corresponding noise matrix.

In the following analysis, assume $N_{M,sys}$ follows a normal distribution and $M_{M,rdm}$ employs the latest $TiO_2$ device measurement result. Coefficient $Corr_M$ represents the correlation degree between $M_1$ and $M_2$. When $Corr_M=1$, the two arrays have the same systematic noise.

Sensing Resistance: Similarly, classify the noise induced by $R_S$ variations into the systematic noise $N_{R,sys}$ and the random noise $N_{R,rdm}$. The actual sensing resistance vector $R_S'$ becomes:

$$R_S'=R_S \circ N_{Rs}=R_S \circ (1+N_{R,rdm}) \quad (15)$$

Accordingly, $C_R'$, the connection matrix including noise is:

$$C_R'=C \circ N_{CR}=C \circ [N_{Rs}, N_{Rs}, \ldots, N_{Rs}] \quad (16)$$

where $N_{CR}$ is the noise matrix of C after including the process variation of the sensing resistors.

The mean of the $r_s$ distribution reflects its systematic process variations. It can be obtained during post-fabrication test and its impact can be cancelled out in training procedure with proper design configuration. Thus, in the following analysis, we only consider the random noise $N_{R,rdm}$ in a normal distribution.

2) Signal Fluctuations

The electrical noise from the power supplies and the neighboring wires can significantly degrade the quality of analog signals. Different from the process variations that remain unchanged after the circuit is fabricated, signal fluctuations vary during circuit operation. Without loss of generality, we assume the runtime noise of the summing amplifiers' 40 output signals follow a normal distribution, same as that of the outputs of the comparators 50.

3) Physical Challenges

There are three major physical constraints in the circuit implementation: (a) For any $V_i(0) \in V(0)$, the voltage amplitude of initial input signal $V_i(0)$ is limited by input circuit; (b) The boundary voltage $V_{bn}$ must be smaller than $V_{th}$ of the memristors 10; and (c) the summing amplifier 40 has a finite resolution.

In the BSB recall function (2), the ratio between the boundaries of S() and the initial amplitude of $x_i(0)$, $x_i(0) \in x(0)$ determines the performance and quality of the recall operation: a larger ratio results in more iteration with higher accuracy, while a small ratio makes convergence faster by lowering system stability. Accordingly, reducing the ratio of $V_{bn}$ and $|V_i(0)|$ in BSB circuit helps improve recall speed. However, the amplifier has a finite resolution and $V_{bn}$ is limited within $V_{th}$ of the memristor. Continuously reducing $|V_u(0)|$ eventually will lead to a loss of information. So the resolution of the summing amplifier is a key parameter to determine the optimal ratio of $V_{bn}$ and $|V_i(0)|$ and the overall design cost.

4) Impact of Sneak Paths

When utilizing crossbars as memories, only one WL is raised up and one or a few BLs are accessible at a time (see FIG. 2). The other WLs and BLs remain floating. Such a single-input-single-output (SISO) access inevitably results in currents through unintended paths, called the sneak paths [29], [30]. The existence of sneak paths in the passive resistive network is a well-known issue, which greatly limits the size of crossbar arrays and their utilization in memory design. During a recall process, present invention's design accesses the crossbar in multi-input-multi-output (MIMO) mode therefore the sneak path is not an issue.

The training process has subtleties. In the present invention the training voltage is slightly higher than $V_{th}$ but much smaller than the switching voltage used in memory operation, because only a small change of memristance is needed in each training step. Hence, the voltage drop on the other memristors is smaller than $V_{th}$ therefore will not result in the unexpected memristance changes.

More importantly, the sneak paths have to be well controlled in memory design because the current through the target device is a critical parameter. In contrast, the major concern in neuromorphic design design is that the association between input and output signals can be properly captured (in training) and reflected (in recall) by the memristor crossbar array. The current distribution within the crossbar is not in the area of interest.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A method for programming neural networks having row and column arrays of resistive memory devices, said method comprising the steps of:
   initializing said resistive memory devices to a predetermined resistance value;
   determining whether a training status tracker indicates that an overall training process is completed;
   selecting a training pattern;
   inputting said training pattern to said arrays and outputting a resulting signal;
   detecting error by computing the difference between said output signal and an expected output signal value;
   determining whether said detected error is within a near zero threshold and if so,
      updating said training progress in said training status tracker; and
      returning to said step of determining whether said overall training process is completed;
   otherwise, generating programming signals and adjusting resistance states of said resistive memory devices in said arrays by applying said programming signals;
      resetting the training progress as in the status tracker; and
      returning to said step of determining whether said overall training process is completed.

2. The method of claim 1, wherein said resistive memory devices comprise memristors.

3. The method of claim 2, wherein said step of inputting said training pattern to said arrays further comprises the step of converting said training pattern to a set of input voltages within a predetermined voltage boundary range.

4. The method of claim 3 wherein said voltage boundary range is between −0.1 volts and +0.1 volts.

5. The method of claim 2, wherein said step of selecting a training pattern further comprises the step of identifying and excluding from said selection patterns those that have previously been trained and recorded by said training status tracker.

6. The method of claim 1 wherein said detected error is discretized to any one of −1, 0, or +1.

7. The method of claim 1, wherein said step of detecting error further comprises determining whether $$|V_{out}(i) - \lambda \cdot V_{in}(i)| < \theta$$

where
   θ is the predetermined tolerable difference;
   $V_{out}(i)$ is the value of an output bit of an output vector;
   $V_{in}(i)$ is the value of an input bit of an input vector; and λ is scalar that when multiplied by $V_{in}(i)$ produces an expected target output signal vector.

8. The method of claim 2, wherein said step of inputting said training pattern to said arrays further comprises the steps of inputting said training pattern into one of said arrays of resistive memory devices at a time.

9. The method of claim 8, wherein said step of inputting said training pattern further comprises applying a vector of programming signals to all said rows of said one said column of said arrays of resistive memory devices.

10. The method of claim 9, wherein the amplitude and polarity of said programming signals applied to a particular column is determined by said detected error corresponding to said column.

11. The method of claim 10, wherein for a first of said arrays of resistive memory devices, said programming signals are
    a currently selected training/prototype pattern when error detection output is 1;
    otherwise
    its element-wise negated version when error detection output is −1.

12. The method of claim 9, wherein said programming signals for a first of said arrays of resistive memory devices has an opposite polarity from a set of programming signals for second of said arrays of resistive memory devices.

13. The method of claim 9, wherein for a second of said arrays of resistive memory devices, the programming signals are
    either the currently selected training/prototype pattern when error detection output is −1;
    otherwise
    its element-wise negated version when error detection output is 1.

14. The method of claim 13, wherein the voltage of said programming signals is greater than the programming threshold voltage of any said memristor in a column being programmed.

15. An apparatus for programming neural networks having row and column arrays of resistive memory devices, said apparatus comprising:
    a training status tracker (ST) for tracking overall training progress so as to keep record of training patterns to be excluded for a subsequent training pattern selection, and determining whether said overall training is completed;
    a read/write (R/W) control component that controls a recall and programming mode of a BSB recall circuit;
    a programming signal generator for generating signals to said arrays of resistive memory devices so as to adjust the resistance states of said resistive memory devices;
    an error detector for computing the difference between said training pattern input into said neural network and an output signal therefrom;
    an arbiter for determining whether said detected error is a vector of logic zero values and if so, said arbiter
        causes said status tracker to update training progress; and
        checks said status tracker to determine whether said overall training is completed;
    otherwise, said arbiter
        causes said programming signal generator to enable a programming mode of said arrays of resistive memory devices so as to adjust memristor resistance states;
        causes said status tracker to reset training progress; and
        checks said status tracker to determine whether said neural overall training is completed.

16. The apparatus of claim 15, wherein said R/W control component converts said training pattern to a set of input voltages within a predetermined voltage boundary range.

17. The apparatus of claim 16 wherein said voltage boundary range is between −0.1 volts and +0.1 volts.

18. The apparatus of claim 15, wherein said arbiter identifies and excludes from said selection patterns those that have been marked as trained by said status tracker (ST).

19. The apparatus of claim 15 wherein said detected error is discretized to any one of −1, 0, or +1.

20. The apparatus of claim 15, wherein said error detector determines whether $$|V_{out}(i) - \lambda \cdot V_{in}(i)| < \theta$$

where
    θ is the predetermined tolerable difference;
    $V_{out}(i)$ s the value of an output bit of an output vector;
    $V_{in}(i)$ is the value of an input bit of an input vector; and
    λ is scalar that when multiplied by $V_{in}(i)$ produces a target output signal vector.

21. The apparatus of claim 15, wherein said apparatus trains one of said arrays of resistive memory devices at a time.

22. The apparatus of claim 21, wherein said apparatus applies a group of programming signals to all said rows of said one said column of said arrays of resistive memory devices.

23. The apparatus of claim 22, wherein the amplitude and polarity of said programming signals applied to a particular column is determined by said detected error corresponding to said column.

24. The method of claim 23, wherein for a first of said arrays of resistive memory devices, said programming signal is
    a currently selected training pattern when said error detection output is 1;
    otherwise said programming signal is
    its element-wise negated version when said error detection output is −1.

25. The apparatus of claim 24, wherein said programming signal for a first of said arrays of resistive memory devices has an opposite polarity from a programming signal for a second of said arrays of resistive memory devices.

26. The apparatus of claim 25, wherein for said second of said arrays of resistive memory devices, said programming signal is
    a currently selected training pattern when said error detection output is −1;
    otherwise said programing signal is
    its element-wise negated version when said error detection output is 1.

27. The apparatus of claim 15, wherein said resistive memory devices comprise memristors.

28. The apparatus of claim 27, wherein said voltage of said programming signal is greater than the programming threshold voltage of any said memristor in a column being programmed.

* * * * *